United States Patent
Tanaka

(10) Patent No.: US 11,751,419 B2
(45) Date of Patent: Sep. 5, 2023

(54) FLEXIBLE DISPLAY DEVICE HAVING NON-FLEXIBLE SUBSTRATE HAVING BASE LAYER INCLUDING INORGANIC FILM BETWEEN RESIN LAYERS

(71) Applicant: SHARP KABUSHIKI KAISHA, Sakai (JP)

(72) Inventor: Tetsunori Tanaka, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 17/553,111

(22) Filed: Dec. 16, 2021

(65) Prior Publication Data

US 2022/0109130 A1 Apr. 7, 2022

Related U.S. Application Data

(62) Division of application No. 16/754,626, filed as application No. PCT/JP2017/036986 on Oct. 12, 2017, now Pat. No. 11,239,453.

(51) Int. Cl.
| | |
|---|---|
| H10K 50/842 | (2023.01) |
| H10K 50/844 | (2023.01) |
| H10K 50/84 | (2023.01) |
| H10K 71/00 | (2023.01) |
| H10K 102/00 | (2023.01) |

(52) U.S. Cl.
CPC ....... *H10K 50/8426* (2023.02); *H10K 50/844* (2023.02); *H10K 50/846* (2023.02); *H10K 50/8445* (2023.02); *H10K 71/00* (2023.02); *H10K 2102/00* (2023.02); *H10K 2102/311* (2023.02)

(58) Field of Classification Search
CPC ............ H01L 51/5246; H01L 51/5253; H01L 51/5256; H01L 51/5259; H01L 51/0097; H01L 2251/5338; H10K 50/8426; H10K 50/846; H10K 50/844; H10K 50/8445
See application file for complete search history.

(56) References Cited

U.S. PATENT DOCUMENTS

| | | | |
|---|---|---|---|
| 2014/0346473 A1* | 11/2014 | Park | H01L 51/0097 257/40 |
| 2015/0207098 A1* | 7/2015 | Yasuda | H01L 51/5221 438/26 |
| 2016/0072099 A1* | 3/2016 | Okamoto | C23C 16/36 118/721 |
| 2016/0164030 A1* | 6/2016 | Yasuda | G02F 1/133305 349/122 |
| 2019/0150235 A1* | 5/2019 | Kikuchi | H05B 33/04 257/40 |

* cited by examiner

*Primary Examiner* — Michael Jung
(74) *Attorney, Agent, or Firm* — ScienBiziP, P.C.

(57) ABSTRACT

In a non-flexible substrate (10) including a base layer (2), the base layer (2) includes a portion where a first resin layer (2a), an inorganic film (2b'), and a second resin layer (2c) are layered in this order, and at an end portion of the base layer (2), the second resin layer (2c) is formed in contact with a glass substrate (1).

12 Claims, 11 Drawing Sheets

FLEXIBLE DISPLAY DEVICE HAVING NON-FLEXIBLE SUBSTRATE HAVING BASE LAYER INCLUDING INORGANIC FILM BETWEEN RESIN LAYERS

TECHNICAL FIELD

The present invention relates to a non-flexible substrate including a base layer, a flexible display device, and a method of manufacturing a flexible display device.

BACKGROUND ART

In recent years, various flat panel displays are being developed. Particularly, Electro Luminescence (EL) display devices and the like, such as organic EL display devices including Organic Light Emitting Diodes (OLEDs), and inorganic EL display devices including inorganic light emitting diodes are receiving great attention because higher picture quality and low power consumption can be achieved.

On the other hand, organic light-emitting diodes and inorganic light-emitting diodes provided on EL display devices as display elements have reliability problems in that their service life may be shortened by the infiltration of foreign matter, such as water and oxygen. Thus, research into preventing foreign matter, such as water and oxygen infiltrating into the display elements is being actively performed.

A flexible display device, having a configuration including a layered film in which a first polyimide resin layer, an inorganic film formed by Chemical Vapor Deposition (CVD) or the like such as, for example, silicon oxide, silicon nitride, and silicon oxynitride, and a second polyimide resin layer are layered in this order as a base layer disposed on a substrate, has been receiving great attention due to its two polyimide resin layers, which are highly effective at preventing the infiltration of foreign matter, such as water and oxygen.

CITATION LIST

Patent Literature

PTL 1: JP 2008-242249 A (published on Oct. 9, 2008).

SUMMARY OF INVENTION

Technical Problem

FIGS. 10A to 10B are diagrams for describing a schematic configuration of a conventional base layer 102 and problems associated with the conventional base layer 102.

As illustrated in (a) of FIGS. 10A to 10B, for example, a first resin layer 102a of polyimide resin is formed on the entire surface of a glass substrate 101 (non-flexible substrate) on one side except at end portion regions of the glass substrate 101. An inorganic film 102b formed by CVD or the like is formed on the entire surface of the glass substrate 101 covering the first resin layer 102a.

A second resin layer 102c of polyimide resin, for example, is formed on the inorganic film 102b covering the inorganic film 102b except for at end portion regions.

As illustrated in (b) of FIGS. 10A to 10B, the glass substrate 101 and the first resin layer 102a have excellent adhesion to one another. Also, the inorganic film 102b and the first resin layer 102a as well as the inorganic film 102b and the glass substrate 101 have favorable adhesion to one another. However, the inorganic film 102b and the second resin layer 102c have poor adhesion to one another.

Since the adhesion between the inorganic film 102b and the second resin layer 102c is poor, in a washing step or the like included in a post-process, for example, film peeling may occur at the interface of the inorganic film 102b and the second resin layer 102c.

Such film peeling is problematic because peeling progresses from the end portion inward, as illustrated.

FIGS. 11A to 11C are diagrams for describing a Laser Lift Off step (also referred to as an LLO step) needed for manufacturing a flexible organic EL display device including the conventional base layer 102 illustrated in FIGS. 10A to 10B.

As illustrated in (a) of FIGS. 11A to 11C, the base layer 102, in which the first resin layer 102a, the inorganic film 102b, and the second resin layer 102c are layered, is formed on a surface 101a on one side of the glass substrate 101 except the end portion region of the glass substrate 101.

A moisture-barrier layer 103 is formed on the base layer 102, and a TFT array layer 104 including a thin film transistor element (TFT element) and an insulating film is form on the moisture-barrier layer 103.

Then, a red light-emitting organic EL element 105R, a green light-emitting organic EL element 105G, and a blue light-emitting organic EL element 105B are formed as display elements on the TFT array layer 104, and a sealing film 106 is formed to cover the red light-emitting organic EL element 105R, the green light-emitting organic EL element 105G, and the blue light-emitting organic EL element 105B.

Note that, each of the red light-emitting organic EL element 105R, the green light-emitting organic EL element 105G, and the blue light-emitting organic EL element 105B is, for example, a layered body (not illustrated) including a first electrode, a hole injection layer, a hole transport layer, a light-emitting layer in each color, an electron transport layer, an electron injection layer, and a second electrode, which are formed in a pattern corresponding to each of the pixels.

In the LLO step, as illustrated in (a) of FIGS. 11A to 11C, laser light irradiation is performed from the glass substrate 101 side. Accordingly, ablation occurs at an interface between the first resin layer 102a constituting the base layer 102 and the glass substrate 101, and the glass substrate 101 is then peeled from the first resin layer 102a as illustrated in (b) of FIGS. 11A to 11C.

Next, as illustrated in (c) of FIGS. 11A to 11C, a back film 111 being a flexible substrate is bonded to the first resin layer 102a with an adhesive layer 110 therebetween. The adhesive layer is provided on a surface 111a on one side of the back film 111. Then, the flexible organic EL display device is completed.

As described above, in the manufacturing process of the flexible organic EL display device including a conventional base layer 102 including the inorganic film 102b and the second resin layer 102c which have poor adhesion to one another, film peeling at the interface of the inorganic film 102b and the second resin layer 102c tends to occur. Thus, yield of the flexible organic EL display device may decrease.

The present invention has been made in view of the above issue, and aims to provide a non-flexible substrate including a base layer resistant to film peeling during a manufacturing process, a flexible display device with high yield, and a method of manufacturing the same.

Solution to Problem

To solve the problem described above, a method of manufacturing a flexible display device according to the present invention includes forming a base layer on a non-flexible substrate, the base layer including a first resin layer, an inorganic film, and a second resin layer layered in this order, wherein the forming of a base layer includes a first step of forming the first resin layer inward from an end portion region of the non-flexible substrate, a second step of forming the inorganic film on at least a portion of the first resin layer such that a portion of the non-flexible substrate and/or a portion of the first resin layer is exposed, and a third step of forming the second resin layer in contact with a portion of the non-flexible substrate exposed from the inorganic film and/or a portion of the first resin layer exposed from the inorganic film, and the method further includes peeling the non-flexible substrate and bonding a flexible substrate to at least the first resin layer via an adhesive layer.

According to the method described above, a flexible display device with high yield can be manufactured.

To solve the problem described above, a non-flexible substrate including a base layer according to the present invention includes a non-flexible substrate, and a base layer disposed on the non-flexible substrate, wherein the base layer includes a portion where a first resin layer, an inorganic film, and a second resin layer are layered in this order, and at an end portion of the base layer, the second resin layer is formed in contact with the non-flexible substrate or the first resin layer.

According to the configuration described above, a non-flexible substrate including a base layer resistant to film peeling during a manufacturing process can be realized.

To solve the problem described above, a flexible display device according to the present invention includes a flexible substrate, a base layer disposed on the flexible substrate; and a display element disposed on the base layer, wherein the base layer includes a portion where a first resin layer, an inorganic film, and a second resin layer are layered in this order, and at an end portion of the base layer, the second resin layer is formed in contact with the first resin layer or the flexible substrate via an adhesive layer.

According to the configuration described above, a flexible display device with high yield can be realized.

Advantageous Effects of Invention

An aspect of the present invention can provide a non-flexible substrate including a base layer resistant to film peeling during a manufacturing process, a flexible display device with high yield, and a method of manufacturing the same.

DESCRIPTION OF EMBODIMENTS

Figure 1A:
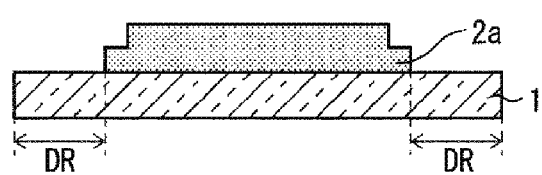
FIGS. 1A to 1E are diagrams for describing a manufacturing process of a non-flexible substrate including a base layer according to a first embodiment.
Figure 1B:
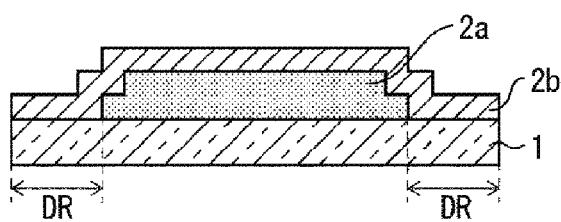
Figure 1C:
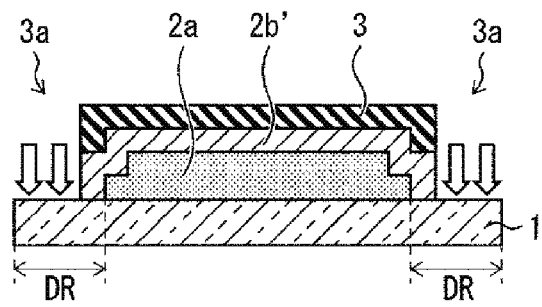
Figure 1D:
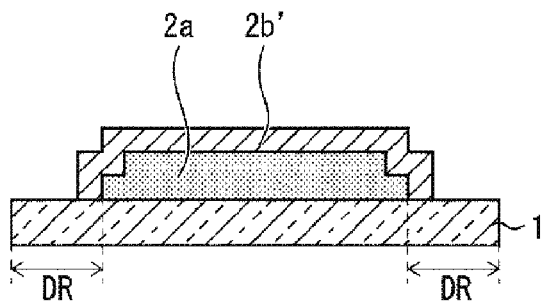
Figure 1E:
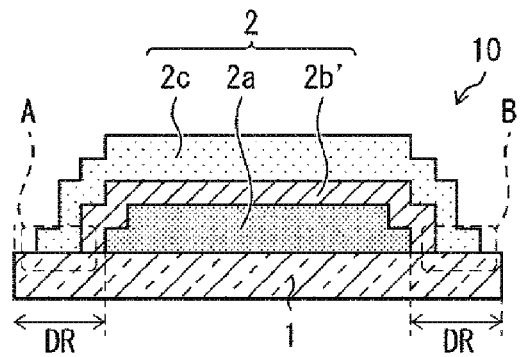

Embodiments of the present invention will be described below with reference to FIGS. 1A to 1E to 9. Hereinafter, for convenience of description, components having the same functions as those described in a specific embodiment are denoted by the same reference numerals, and descriptions thereof may be omitted.

Note that, in the following embodiment, a flexible organic EL display device including a red light-emitting organic EL element, a green light-emitting organic EL element, and a blue light-emitting organic EL element as display elements is described as one example, but no such limitation is intended. The display elements, for example, may be reflective liquid crystal display elements, inorganic light emitting diodes, Quantum dot Light Emitting Diodes (QLED), or the like.

First Embodiment

Next, a description is given of the first embodiment of the present invention based on FIGS. 1A to 1E and 2.

Figure 10A:
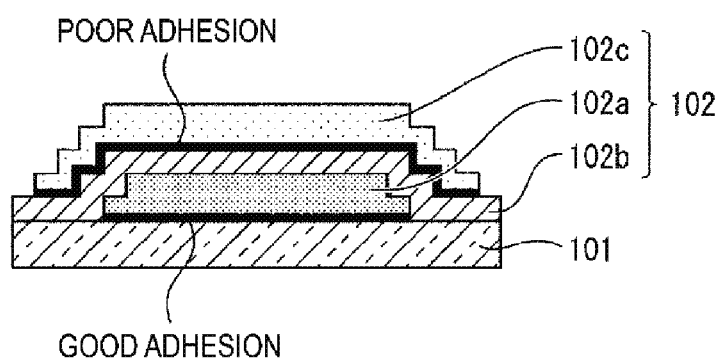
FIGS. 10A to 10B are diagrams for describing a schematic configuration of a conventional base layer and problems associated with the conventional base layer.
Figure 10B:
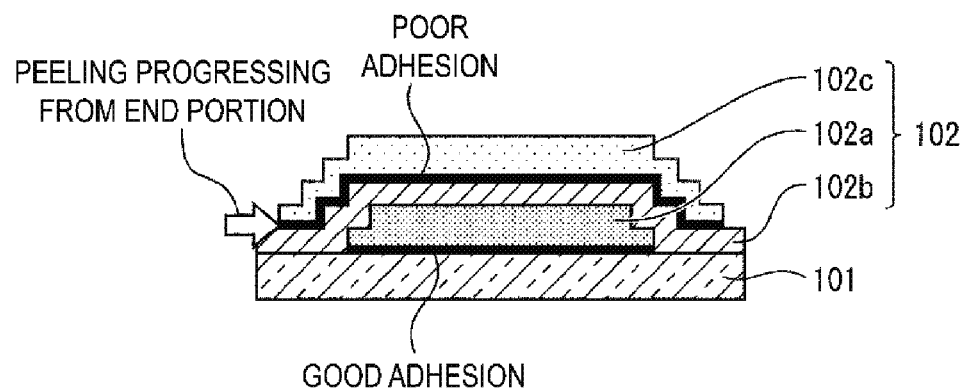
Figure 11A:
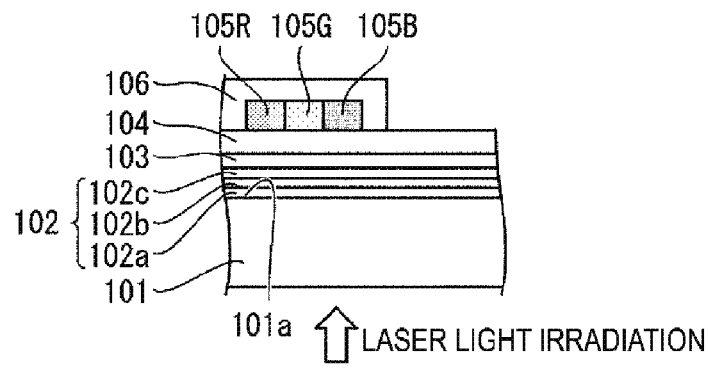
FIGS. 11A to 11C are diagrams for describing a Laser Lift Off step (also referred to as an LLO step) needed for manufacturing a flexible organic EL display device including the conventional base layer illustrated in FIGS. 10A to 10B.
Figure 11B:
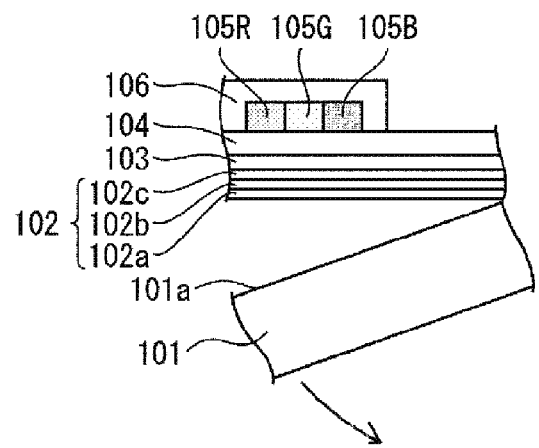
Figure 11C:
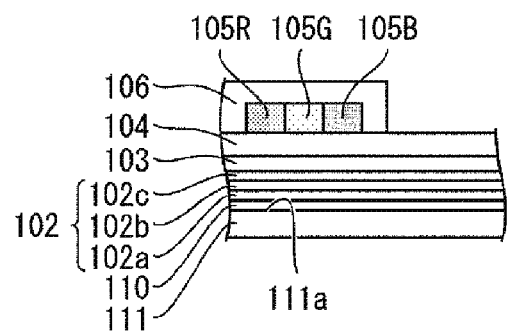

In the present embodiment, the shape of a base layer 2 is different from the shape of the conventional base layer 102 described above with reference to FIGS. 10A to 10B and 11.

FIGS. 1A to 1E are diagrams for describing a manufacturing process of a non-flexible substrate 10 including the base layer 2.

First, as illustrated in (a) of FIGS. 1A to 1E, for example, a first resin layer 2a of polyimide resin is formed on the entire surface of a glass substrate 1 on one side except at an end portion region DR of the glass substrate 1.

Thereafter, the first resin layer 2a is heat treated. In the present embodiment, the heat treatment of the first resin layer 2a includes two heat treatments including pre-baking that is a relatively low temperature process, and post-baking that is a relatively high temperature process, but no such limitation is intended. Heat treatment of the first resin layer 2a may be performed once or three times or more.

The present embodiment will be described with an example in which the glass substrate 1 is used as an example of the non-flexible substrate. However, the non-flexible substrate is not limited to being a glass substrate and is only required to be a substrate that can withstand relatively high temperature post-processes such as processes of forming a thin film transistor element (TFT element) and forming an organic EL element and a substrate with good adhesion to the first resin layer 2a and a second resin layer 2c described below.

Also, the present embodiment is described with an example in which a polyimide resin not containing a photosensitive material is used as the first resin layer 2a, and the first resin layer 2a is formed on the entire surface of the glass substrate 1 except the end portion region DR using a slit coater or the like with coating region being adjusted. However, no such limitation is intended. For example, a polyimide resin containing a photosensitive material may be used as the first resin layer 2a, the first resin layer 2a may be formed on the entire surface of the glass substrate 1 using a spin coater or the like, and the first resin layer 2a may be caused to remain on the entire surface of the glass substrate 1 except the end portion region DR through exposure and development steps.

Furthermore, the present embodiment is an example in which a polyimide resin is used as the first resin layer 2a. However, the type of resin is not particularly limited and is only required to be compatible with the Laser Lift Off step (LLO step) and have good adhesion with the glass substrate 1.

Thereafter, as illustrated in (b) of FIGS. 1A to 1E, Chemical Vapor Deposition (CVD) and the like is used to form an inorganic film 2b on the entire surface of the glass substrate 1 so that the first resin layer 2a is covered by the inorganic film 2b.

The present embodiment will be described with an example in which a silicon nitride film formed by CVD is used as the inorganic film 2b. However, no such limitation is intended. For example, a silicon oxide film or a silicon oxynitride film formed by CVD may be used.

Also, an inorganic film formed by a method other than CVD may be used as the inorganic film 2b.

As illustrated in (c) of FIGS. 1A to 1E, a resist film 3 including an opening 3a is formed, and dry etching is performed using the resist film 3 as a mask. In this way, the inorganic film 2b illustrated in (b) of FIGS. 1A to 1E are formed as an inorganic film 2b'.

In other words, the inorganic film 2b illustrated in (b) of FIGS. 1A to 1E are formed covering the first resin layer 2a and entirely covering the end portion region DR of the glass substrate 1. However, the inorganic film 2b', after dry etching, remains only on the portion in the end portion region DR of the glass substrate 1 covering the first resin layer 2a, with the rest of the inorganic film 2b' being removed such that the glass substrate 1 is exposed.

The present embodiment is an example in which the inorganic film 2b' remains only on the portion in the end portion region DR of the glass substrate 1 covering the first resin layer 2a, with the rest of the inorganic film 2b' being removed such that the glass substrate 1 is exposed. However, no such limitation is intended.

The second resin layer 2c described below is only required to come into direct contact with the glass substrate 1 in the end portion region DR of the glass substrate 1. For example, in the dry etching step illustrated in (c) of FIGS. 1A to 1E, a portion or all of the inorganic film 2b formed in the end portion region DR of the glass substrate 1 may be removed.

As illustrated in (b) and (c) of FIGS. 1A to 1E, note that the present embodiment is described with an example in which, after the inorganic film 2b is formed on the entire surface of the glass substrate 1, dry etching is performed using the resist film 3 as a mask and a portion of the end portion region DR of the glass substrate 1 is exposed. However, no such limitation is intended. For example, in forming the inorganic film 2b illustrated in (b) of FIGS. 1A to 1E, the inorganic film 2b may be formed in advance using a vapor deposition mask so that the end portion region DR of the glass substrate 1 is partially or completely exposed. In this case, the step of dry etching illustrated in (c) of FIGS. 1A to 1E using the resist film 3 as a mask can be omitted.

Next, as illustrated in (d) of FIGS. 1A to 1E, by peeling the resist film 3, a portion of the end portion region DR of the glass substrate 1 is exposed and the glass substrate 1 including the first resin layer 2a and the inorganic film 2b' formed covering the first resin layer 2a is realized.

Then, as illustrated in (e) of FIGS. 1A to 1E, the second resin layer 2c is formed covering the inorganic film 2b' and being in direct contact with a portion of the exposed end portion region DR of the glass substrate 1 (see portion A and portion B in (e) of FIGS. 1A to 1E).

Next, the second resin layer 2c is heat treated. In the present embodiment, the heat treatment of the second resin layer 2c includes two heat treatments including pre-baking that is a relatively low temperature process, and post-baking that is a relatively high temperature process, but no such limitation is intended. Heat treatment of the second resin layer 2c may be performed once or three times or more.

Also, the present embodiment is described with an example in which a polyimide resin not containing a photosensitive material is used as the second resin layer 2c, a coating region is adjusted using a slit coater or the like, and the second resin layer 2c is formed. However, no such limitation is intended. For example, a polyimide resin containing a photosensitive material may be used as the second resin layer 2c. After the second resin layer 2c may be formed on the entire surface of the glass substrate 1 using a spin coater or the like, the second resin layer 2c may be formed in a predetermined pattern through exposure and development steps.

Also, the present embodiment is described with an example in which a polyimide resin of the same material as the first resin layer 2a with good adhesion with the glass substrate 1 is used as the second resin layer 2c. However, the material is not limited thereto. The material is only required to have good adhesion with the glass substrate 1 and may be a different material than that of the first resin layer 2a.

Figure 2:
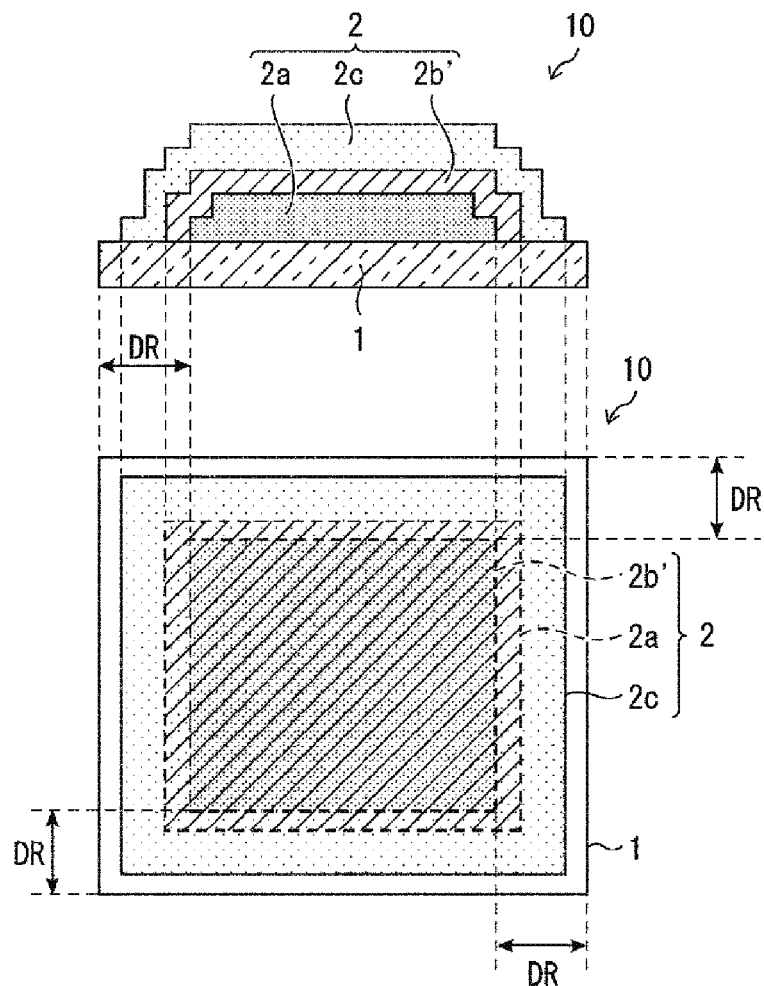
FIG. 2 is a plan view of the non-flexible substrate including the base layer illustrated in FIGS. 1A to 1E.

FIG. 2 is a plan view of the non-flexible substrate 10 including the base layer 2 illustrated in (e) of FIGS. 1A to 1E.

The present embodiment is described with an example in which a single large base layer 2 is formed on the glass substrate 1 as illustrated in FIG. 2 to realize a relatively large flexible display device. However, no such limitation is intended, and a plurality of island shaped base layers may be formed on the glass substrate 1 as described in a second embodiment described below.

As illustrated in (e) of FIGS. 1A to 1E and FIG. 2, in the non-flexible substrate 10 including the base layer 2 including the layered film of the first resin layer 2a, the inorganic film 2b', and the second resin layer 2c, the adhesion between the second resin layer 2c and the inorganic film 2b' is poor. However, the second resin layer 2c is in direct contact with the glass substrate 1 in the end portion region DR of the glass substrate 1 to which the second resin layer 2c has good adhesion.

As described above, inward from the end portion region DR of the glass substrate 1, the second resin layer 2c has poor adhesion with a foundation film, but has good adhesion with the foundation film in the end portion region DR of the glass substrate 1.

Thus, in the non-flexible substrate 10 including the base layer 2, in a washing step and the like included in a post-process, for example, peeling of the second resin layer 2c advancing from the end portion can be suppressed.

Note that a step of forming a moisture-barrier layer on the base layer 2, a step of forming a TFT array layer including a thin film transistor element (TFT element) and an insulating film, a step of forming an organic EL element as a display element on the TFT array layer, a step of forming a sealing film that covers the organic EL element, and an LLO step are the same as those described above with reference to FIGS. 11A to 11C. Thus, the descriptions thereof will be omitted.

Also, in the case of a flexible display device obtained through performing each of the steps described above (from the step of forming the moisture-barrier layer to the LLO step) on the non-flexible substrate 10 including the base layer 2, in each of the steps described above, peeling of the second resin layer 2c advancing from the end portion can be suppressed. Thus, a flexible display device with high yield can be realized.

Note that in the non-flexible substrate 10 including the base layer 2, at the end portion of the base layer 2, the second resin layer 2c is formed in contact with the glass substrate 1.

On the other hand, in the case of a flexible display device including the base layer 2, at the end portion of the base layer 2, the second resin layer 2c may be formed in contact with the back film 111, i.e., a flexible substrate, via the adhesive layer 110. However, in some cases, the flexible display device including the base layer 2 is singulated into a plurality. In a case where a step of dividing by laser at the inner side of the base layer 2 or the like is included, depending on the divided section, portions of the second resin layer 2c in contact with the back film 111, i.e., a flexible substrate, via the adhesive layer 110 may be removed, and the flexible display device after singulation may not include these portions. In this case, only the portion of the first resin layer 2a in contact with the back film 111, i.e., a flexible substrate, via the adhesive layer 110 remains.

Note that the present embodiment is described with an example in which, as illustrated in FIGS. 1A to 1E and 2, the inorganic film 2b' completely covers the first resin layer 2a. However, no such limitation is intended, and as described in the third to sixth embodiments described below, the inorganic film 2b' is preferably formed on only a portion of the first resin layer 2a. In other words, the inorganic film 2b' preferably includes an opening through which the first resin layer 2a is exposed.

In this way, the second resin layer 2c can be in direct contact with the glass substrate 1 with which it has good adhesion at the end portion region DR of the glass substrate 1, and in direct contact with the first resin layer 2a. Thus, a flexible display device with high yield can be manufactured.

Note that in the present embodiment, the width of the end portion region DR is made relatively large so that the second resin layer 2c can be formed within the end portion region DR of the glass substrate 1. However, no such limitation is intended. As described in the third embodiment described below, in embodiments in which the second resin layer is not required to be formed within the end portion region DR of the glass substrate 1, the width of the end portion region DR may be greatly reduced.

Second Embodiment

Next, a description is given of the second embodiment of the present invention will be described based on FIG. 3. A non-flexible substrate 20 according to the present embodiment is different from the first embodiment in that a plurality of island shaped base layers 2' are formed on the glass substrate 1, and the other matters are as described in the first embodiment. For convenience of description, members having the same functions as those of the members illustrated in the drawings in the first embodiment are denoted by the same reference numerals, and descriptions thereof will be omitted.

Figure 3:
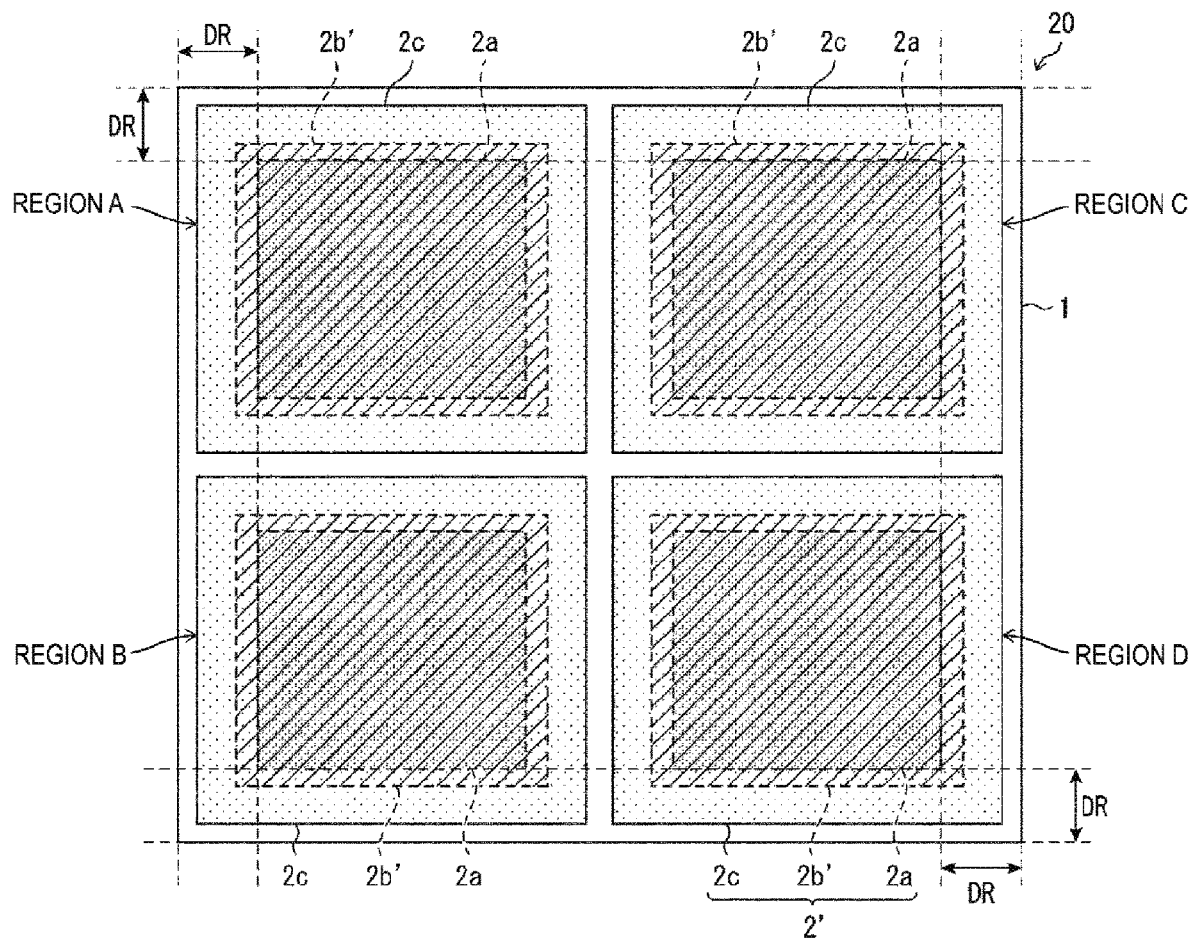
FIG. 3 is a plan view of a non-flexible substrate including a base layer according to a second embodiment.
Figure 4A:
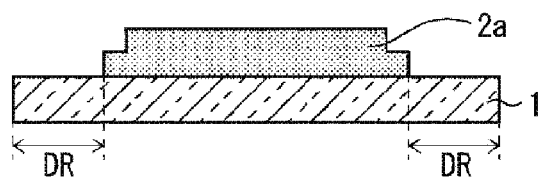
FIGS. 4A to 4E are diagrams for describing a manufacturing process of a non-flexible substrate including a base layer according to a third embodiment.
Figure 4B:
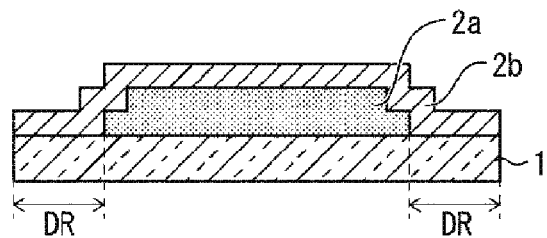
Figure 4C:
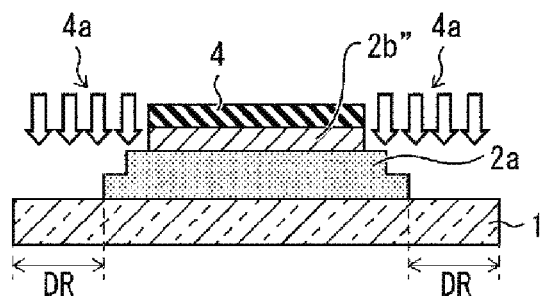
Figure 4D:
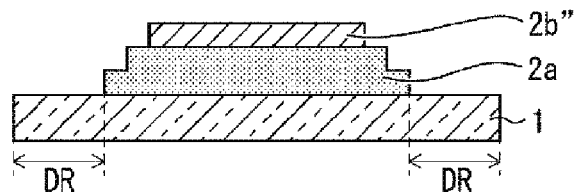
Figure 4E:
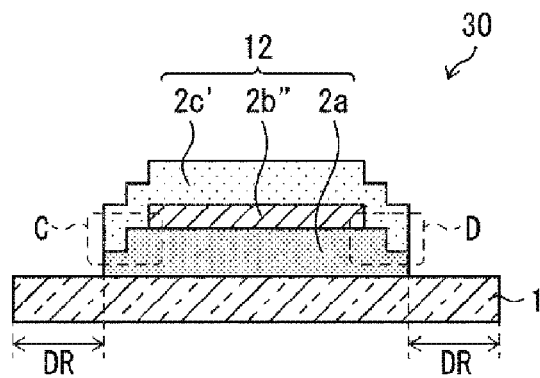

FIG. 3 is a plan view of the non-flexible substrate 20 including the plurality of island shaped base layers 2'.

As illustrated in FIG. 3, in the non-flexible substrate 20, the base layer 2' with the same shape as the base layer 2 in the first embodiment described above is disposed on the glass substrate 1 as a plurality of island shaped base layers (four in the present embodiment) at predetermined intervals.

That is, the base layers 2' are formed in an island shape in each region of a region A, a region B, a region C, and a region D, on the glass substrate 1.

As illustrated in FIG. 3, the first resin layer 2a is formed as a plurality of island shaped layers (four in the present embodiment) inward from the end portion region DR of the glass substrate 1.

Furthermore, the inorganic film 2b' is formed as a plurality of island shaped films (four in the present embodiment) such that the glass substrate 1 is exposed on the outer side of each of the plurality of island shaped first resin layers 2a.

Then, the second resin layer 2c is formed as a plurality of island shaped layers (four in the present embodiment) in contact with the glass substrate 1 exposed from the plurality of island shaped inorganic films 2b'.

The present embodiment is an example in which the inorganic film is formed covering the plurality of island shaped first resin layers 2a and the glass substrate 1, then by removing the inorganic film formed in direct contact with the glass substrate 1, the glass substrate 1 is exposed from the inorganic film 2b' at the outer side of the plurality of island shaped first resin layers 2a. However, no such limitation is intended.

Because the plurality of island shaped base layers 2' provided on the glass substrate 1 have the same shape of the base layer 2 in the first embodiment described above, in the non-flexible substrate 20 including the plurality of island shaped base layers 2', for example, in a washing step and the like included in a post-process, peeling of the second resin layer 2c advancing from the end portion can be suppressed.

Also, in the case of a plurality of flexible display devices obtained through performing each of the steps of the first embodiment described above (from the step of forming the moisture-barrier layer to the LLO step) and an additional step of dividing by laser or the like on the non-flexible substrate 20 including the plurality of island shaped base layers 2', in each of the steps described above, peeling of the second resin layer 2c advancing from the end portion can be suppressed. Thus, a flexible display device with high yield can be realized.

Note that in the non-flexible substrate 20 including the plurality of base layers 2' formed in the region A, the region B, the region C, and the region D, at the end portions of each of the plurality of base layers 2', the second resin layer 2c is formed in contact with the glass substrate 1.

On the other hand, in the case of a flexible display device including the plurality of base layers 2' being divided at the outer side of each region of the region A, the region B, the region C, and the region D and singulated into a plurality, at the end portions of the plurality of base layers 2', the second resin layer 2c may be formed in contact with the back film 111, i.e., a flexible substrate, via the adhesive layer 110. However, in some examples, the flexible display device including the plurality of base layers 2' is divided on the inner side of each region of the region A, the region B, the region C, and the region D and singulated into a plurality. In such a case, after the flexible display device is singulated, portions of the second resin layer 2c in contact with the back film 111, i.e., a flexible substrate, via the adhesive layer 110 may be removed and the flexible display device after singulation may not include these portions. In this case, only the portion of the first resin layer 2a in contact with the back film 111, i.e., a flexible substrate, via the adhesive layer 110 remains.

Third Embodiment

Next, a third embodiment of the present invention will be described below with reference to FIGS. 4A to 4E and 5. A non-flexible substrate 30 according to the present embodiment is different from the first embodiment in that an inorganic film 2b" is formed so that a region of the first resin layer 2a near the end portion region DR of the glass substrate 1 is exposed and the second resin layer 2c is in direct contact with the exposed first resin layer 2a, and the other matters are as described in the first embodiment. For convenience of description, members having the same functions as those of the members illustrated in the drawings in the first embodiment are denoted by the same reference numerals, and descriptions thereof will be omitted.

FIGS. 4A to 4E are diagrams for describing a manufacturing process of the non-flexible substrate 30 including a base layer 12.

Note that the steps illustrated in (a) and (b) of FIGS. 4A to 4E have already been described with reference to (a) and (b) of FIGS. 1A to 1E in the first embodiment, and thus the description thereof will be omitted.

As illustrated in (c) of FIGS. 4A to 4E, then a resist film 4 including an opening 4a is formed, and dry etching is performed using the resist film 4 as a mask. In this way, the inorganic film 2b illustrated in (b) of FIGS. 4A to 4E are formed as an inorganic film 2b".

The inorganic film 2b illustrated in (b) of FIGS. 4A to 4E are formed covering the first resin layer 2a and entirely covering the end portion region DR of the glass substrate 1. However, the inorganic film 2b", after dry etching is performed so that a region of the first resin layer 2a near the end portion region DR of the glass substrate 1, i.e., an outer edge portion of the first resin layer 2a, is exposed and the inorganic film 2b" is removed from the end portion region DR of the glass substrate 1.

The present embodiment is an example in which the inorganic film 2b" is completely removed from the end portion region DR of the glass substrate 1. However, no such limitation is intended. The inorganic film 2b" is only required to be formed so that a region of the first resin layer 2a near the end portion region DR of the glass substrate 1 is exposed. The inorganic film 2b" may partially or completely remain in the end portion region DR of the glass substrate 1.

As illustrated in (b) and (c) of FIGS. 4A to 4E, note that the present embodiment is described with an example in which, after the inorganic film 2b is formed on the entire surface of the glass substrate 1, dry etching is performed using the resist film 4 as a mask. However, no such limitation is intended. For example, in forming the inorganic film 2b illustrated in (b) of FIGS. 4A to 4E, the inorganic film 2b may be formed in advance using a vapor deposition mask so that a region of the first resin layer 2a near the end portion region DR of the glass substrate 1 is exposed. In this case, the step of dry etching illustrated in (c) of FIGS. 4A to 4E using the resist film 4 as a mask can be omitted.

Next, as illustrated in (d) of FIGS. 4A to 4E, by peeling the resist film 4, the glass substrate 1 including the first resin layer 2a and the inorganic film 2b" formed so that a region of the first resin layer 2a near the end portion region DR of the glass substrate 1 is exposed is realized.

Then, as illustrated in (e) of FIGS. 4A to 4E, a second resin layer 2c' is formed covering the inorganic film 2b" and being in direct contact with the exposed first resin layer 2a (see portion C and portion D in (e) of FIGS. 4A to 4E).

Figure 5:
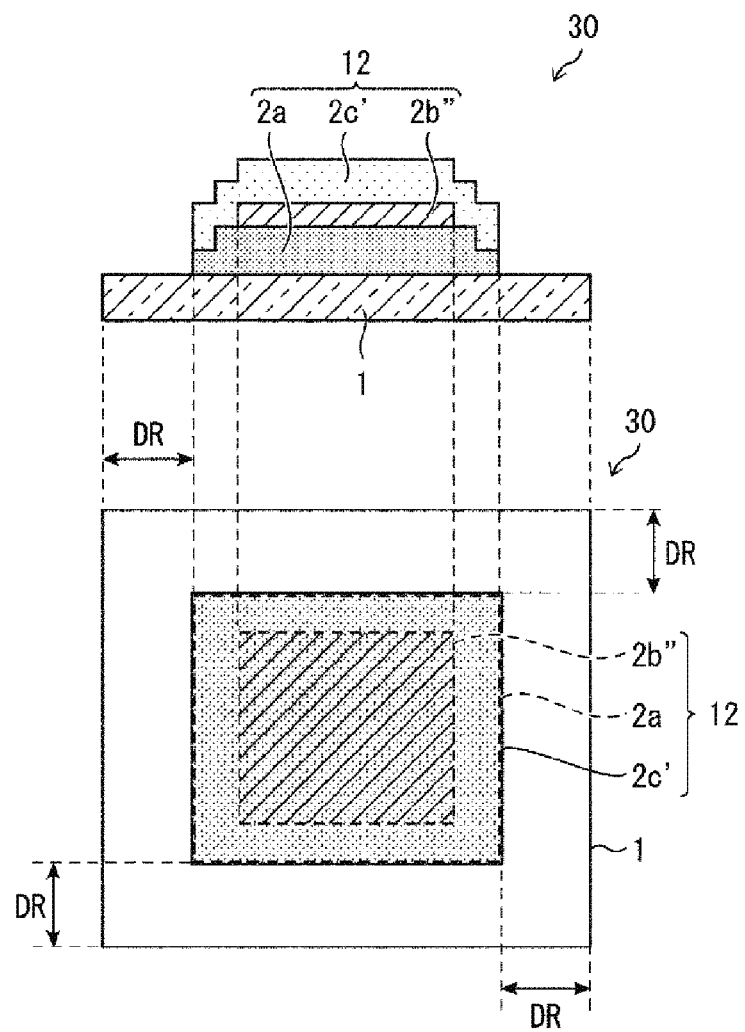
FIG. 5 is a plan view of the non-flexible substrate including the base layer illustrated in FIGS. 4A to 4E.

FIG. 5 is a plan view of the non-flexible substrate 30 including the base layer 12 illustrated in (e) of FIGS. 4A to 4E.

The present embodiment is described with an example in which a single large base layer 12 is formed on the glass substrate 1 as illustrated in FIG. 5 to realize a relatively large flexible display device. However, no such limitation is intended, and a plurality of island shaped base layers may be formed on the glass substrate 1 as described in a fourth embodiment described below.

Note that the materials of the first resin layer 2a, the inorganic film 2b", and the second resin layer 2c' can be the same as the materials of the first resin layer 2a, the inorganic film 2b', and the second resin layer 2c of the first or second embodiment described above. Thus, the description thereof will be omitted.

As illustrated in (e) of FIGS. 4A to 4E and FIG. 5, in the non-flexible substrate 30 including the base layer 12 including the layered film of the first resin layer 2a, the inorganic film 2b", and the second resin layer 2c', the adhesion between the second resin layer 2c' and the inorganic film 2b" is poor. However, the second resin layer 2c' is in direct contact with the first resin layer 2a to which it has good adhesion in a region near the end portion region DR of the glass substrate 1.

The second resin layer 2c' has better adhesion with the first resin layer 2a than with the glass substrate 1.

As described above, in the region where the second resin layer 2c' comes into contact with the inorganic film 2b", the second resin layer 2c' has poor adhesion with a foundation film, but has good adhesion with the foundation film in the region where the second resin layer 2c' comes into contact with the first resin layer 2a.

Thus, in the non-flexible substrate 30 including the base layer 12, for example, in a washing step and the like included in a post-process, for example, peeling of the second resin layer 2c' advancing from the end portion can be suppressed.

Note that a step of forming a moisture-barrier layer on the base layer 12, a step of forming a TFT array layer including a thin film transistor element (TFT element) and an insulating film, a step of forming an organic EL element as a display element on the TFT array layer, a step of forming a sealing film that covers the organic EL element, and an LLO step are the same as those described above with reference to FIGS. 11A to 11C. Thus, the descriptions thereof will be omitted.

Also, in the case of a flexible display device obtained through performing the steps described above (from the step of forming the moisture-barrier layer to the LLO step) on the non-flexible substrate 30 including the base layer 12, in the steps described above, peeling of the second resin layer 2c' advancing from the end portion can be suppressed. Thus, a flexible display device with high yield can be realized.

Note that in the non-flexible substrate 30 including the base layer 12, at the end portion of the base layer 12, the first resin layer 2a and the second resin layer 2c' are formed in contact with one another.

On the other hand, in the case of a flexible display device including the base layer 12, at the end portion of the base layer 12, the first resin layer 2a and the second resin layer 2c' are formed in contact with one another. However, in some examples, the flexible display device including the base layer 12 is singulated into a plurality. In such a case when a step of dividing by laser at the inner side of the base layer 12 or the like is included, depending on the divided section, portions where the first resin layer 2a and the second resin layer 2c' are formed in contact with one another may be removed and the flexible display device after singulation may not include these portions. In this case, only the portion of the first resin layer 2a in contact with the back film 111, i.e., a flexible substrate, via the adhesive layer 110 remains.

Fourth Embodiment

Next, with reference to FIG. 6, a fourth embodiment of the present invention will be described. A non-flexible substrate 40 according to the present embodiment is different from the third embodiment in that a plurality of island shaped base layers 12' are formed on the glass substrate 1, and the other matters are as described in the third embodiment. For convenience of description, members having the same functions as those of the members illustrated in the drawings in the third embodiment are denoted by the same reference numerals, and descriptions thereof will be omitted.

Figure 6:
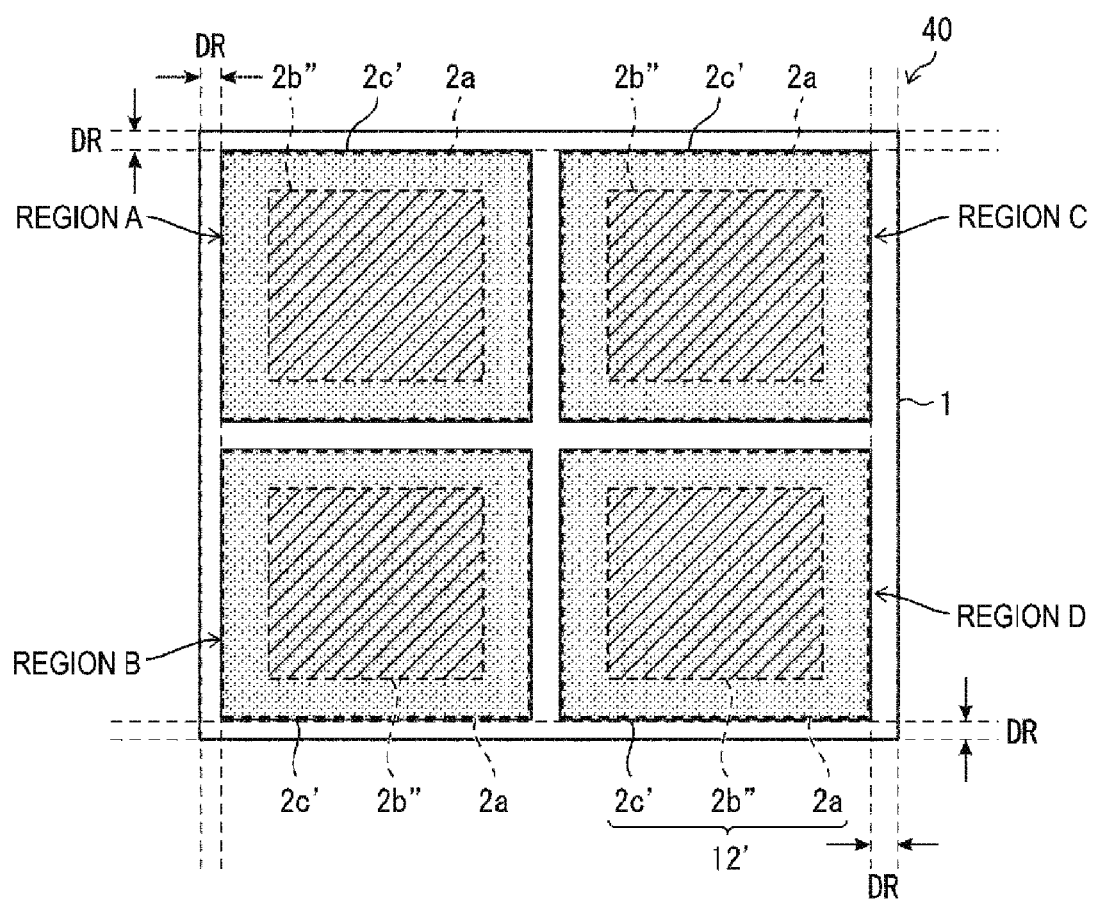
FIG. 6 is a plan view of a non-flexible substrate including a base layer according to a fourth embodiment.
Figure 7A:
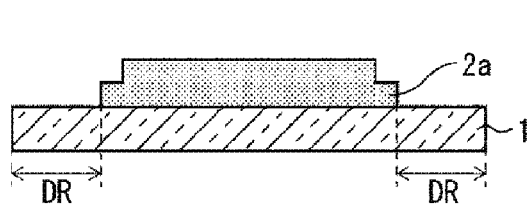
FIGS. 7A to 7E are diagrams for describing a manufacturing process of a non-flexible substrate including a base layer according to a fifth embodiment.
Figure 7B:
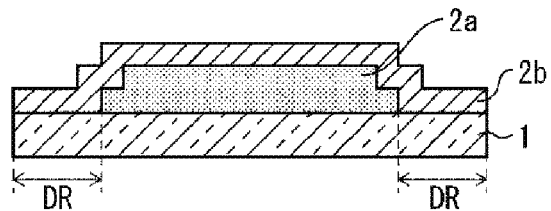
Figure 7C:
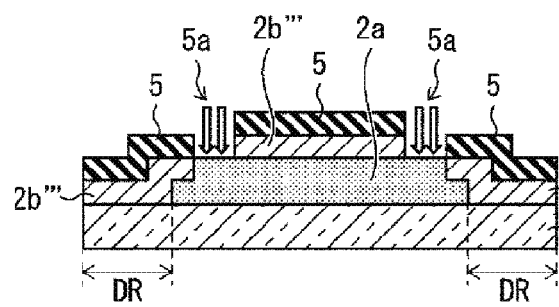
Figure 7D:
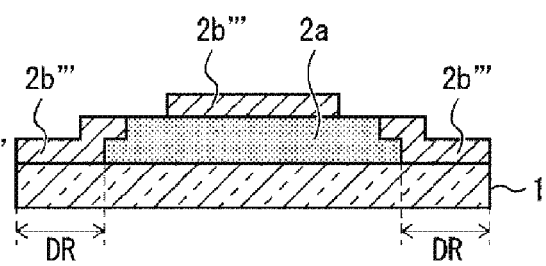
Figure 7E:
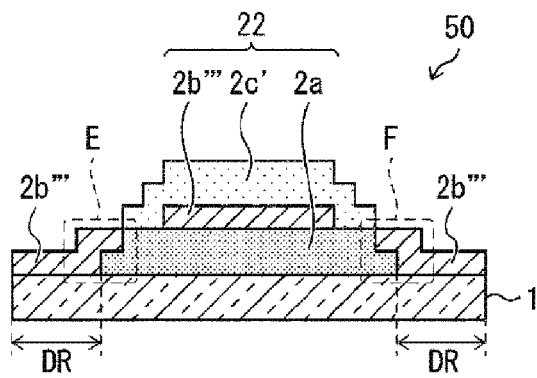

FIG. 6 is a plan view of the non-flexible substrate 40 including the plurality of island shaped base layers 12'.

As illustrated in FIG. 6, in the non-flexible substrate 40, the base layer 12' with the same shape as the base layer 12 in the third embodiment described above is disposed on the glass substrate 1 as a plurality of island shaped base layers (four in the present embodiment) at predetermined intervals.

That is, the base layers 12' are formed in an island shape in each region of a region A, a region B, a region C, and a region D, on the glass substrate 1.

As illustrated in FIG. 6, the first resin layer 2a is formed as a plurality of island shaped layers (four in the present embodiment) inward from the end portion region DR of the glass substrate 1.

Furthermore, the inorganic film 2b'' is formed as a plurality of island shaped films (four in the present embodiment) such that the first resin layer 2a is exposed on the outer edge portion of the plurality of island shaped first resin layers 2a.

Then, the second resin layer 2c' is formed as a plurality of island shaped layers (four in the present embodiment) in contact with the first resin layer 2a exposed from the plurality of island shaped inorganic films 2b''.

The present embodiment is an example in which the inorganic film is formed covering the plurality of island shaped first resin layers 2a and the glass substrate 1, then by removing the inorganic film formed in direct contact with each of the plurality of first resin layers 2a at at least the outer edge portions, the plurality of first resin layers 2a are exposed from the inorganic film 2b'' at the outer edge portions of each of the plurality of first resin layers 2a. However, no such limitation is intended.

Because each of the plurality of island shaped base layers 12' provided on the glass substrate 1 has the same shape as the base layer 12 in the third embodiment described above, in the non-flexible substrate 40 including the plurality of island shaped base layers 12', for example, in a washing step and the like included in a post-process, peeling of the second resin layer 2c' advancing from the end portion can be suppressed.

Also, in the case of a plurality of flexible display devices obtained through performing each of the steps of the third embodiment described above (from the step of forming the moisture-barrier layer to the LLO step) and an additional step of dividing by laser on the non-flexible substrate 40 including the plurality of island shaped base layers 12', in each of the steps described above, peeling of the second resin layer 2c' advancing from the end portion can be suppressed. Thus, a flexible display device with high yield can be realized.

Note that in the non-flexible substrate 40 including the plurality of base layers 12' formed in the region A, the region B, the region C, and the region D, at the end portions of each of the plurality of base layers 12', the first resin layers 2a and the second resin layers 2c' are formed in contact with one another.

On the other hand, in the case of a flexible display device including the plurality of base layers 12' being divided at the outer side of each region of the region A, the region B, the region C, and the region D and singulated into a plurality, at the end portions of the plurality of base layers 12', the first resin layer 2a and the second resin layer 2c' are formed in contact with one another. However, in some examples, the flexible display device including the plurality of base layers 12' is divided on the inner side of each region of the region A, the region B, the region C, and the region D and singulated into a plurality. In such a case, after the flexible display device is singulated, portions where the first resin layer 2a and the second resin layer 2c' are formed in contact with one another may be removed and the flexible display device after singulation may not include these portions. In this case, only the portion of the first resin layer 2a in contact with the back film 111, i.e., a flexible substrate, via the adhesive layer 110 remains.

Fifth Embodiment

Next, a fifth embodiment of the present invention will be described with reference to FIGS. 7A to 7E and 8. A non-flexible substrate 50 according to the present embodiment is different from the third embodiment in that an inorganic film 2b''' is formed so that a region of the first resin layer 2a is exposed near the end portion region DR of the glass substrate 1, and formed covering the end portion of the first resin layer 2a and in contact with the glass substrate 1 in the end portion region DR of the glass substrate 1, and the other matters are as described in the third embodiment. For convenience of description, members having the same functions as those of the members illustrated in the drawings in the third embodiment are denoted by the same reference numerals, and descriptions thereof will be omitted.

FIGS. 7A to 7E are diagrams for describing a manufacturing process of the non-flexible substrate 50 including a base layer 22.

Note that each of the steps illustrated in (a) and (b) of FIGS. 7A to 7E have already been described with reference to (a) and (b) of FIGS. 1A to 1E in the first embodiment, and thus the description thereof will be omitted.

As illustrated in (c) of FIGS. 7A to 7E, a resist film 5 including an opening 5a is formed, and dry etching is performed using the resist film 5 as a mask. In this way, the inorganic film 2b illustrated in (b) of FIG. 5 is formed in a shape in an inorganic film 2b'''.

The inorganic film 2b illustrated in (b) of FIGS. 7A to 7E are formed covering the first resin layer 2a and entirely covering the end portion region DR of the glass substrate 1. However, the inorganic film 2b''' is formed, after dry etching is performed, so that a region of the first resin layer 2*a* inward from the region near the end portion region DR of the glass substrate 1, i.e., a region inward from an outer edge portion of the first resin layer 2*a*, is exposed, and the inorganic film 2*b*''' is formed covering the outer edge portion of the first resin layer 2*a* and in contact with the glass substrate 1 in the end portion region DR of the glass substrate 1.

As illustrated in (b) and (c) of FIGS. 7A to 7E, note that the present embodiment is described with an example in which, after the inorganic film 2*b* is formed on the entire surface of the glass substrate 1, dry etching is performed using the resist film 5 as a mask. However, no such limitation is intended. For example, in the step of forming the inorganic film 2*b* illustrated in (b) of FIGS. 7A to 7E, the inorganic film 2*b* may be formed in advance using a vapor deposition mask so that a region of the first resin layer 2*a* near the end portion region DR of the glass substrate 1 is exposed, and the inorganic film 2*b* may be formed in a shape covering the end portion of the first resin layer 2*a*, and in contact with the glass substrate 1 in the end portion region DR of the glass substrate 1. In this case, the step of dry etching illustrated in (c) of FIGS. 7A to 7E using the resist film 5 as a mask can be omitted.

Next, as illustrated in (d) of FIGS. 7A to 7E, by peeling the resist film 5, the glass substrate 1 including the first resin layer 2*a* and the inorganic film 2*b*''' formed so that a region of the first resin layer 2*a* near the end portion region DR of the glass substrate 1 is exposed and formed covering the end portion of the first resin layer 2*a* and in contact with the glass substrate 1 in the end portion region DR of the glass substrate 1 is realized.

Then, as illustrated in (e) of FIGS. 7A to 7E, a second resin layer 2*c*' is formed covering the inorganic film 2*b*''' and being in direct contact with the exposed first resin layer 2*a* (see portion E and portion F in (e) of FIGS. 7A to 7E).

Figure 8:
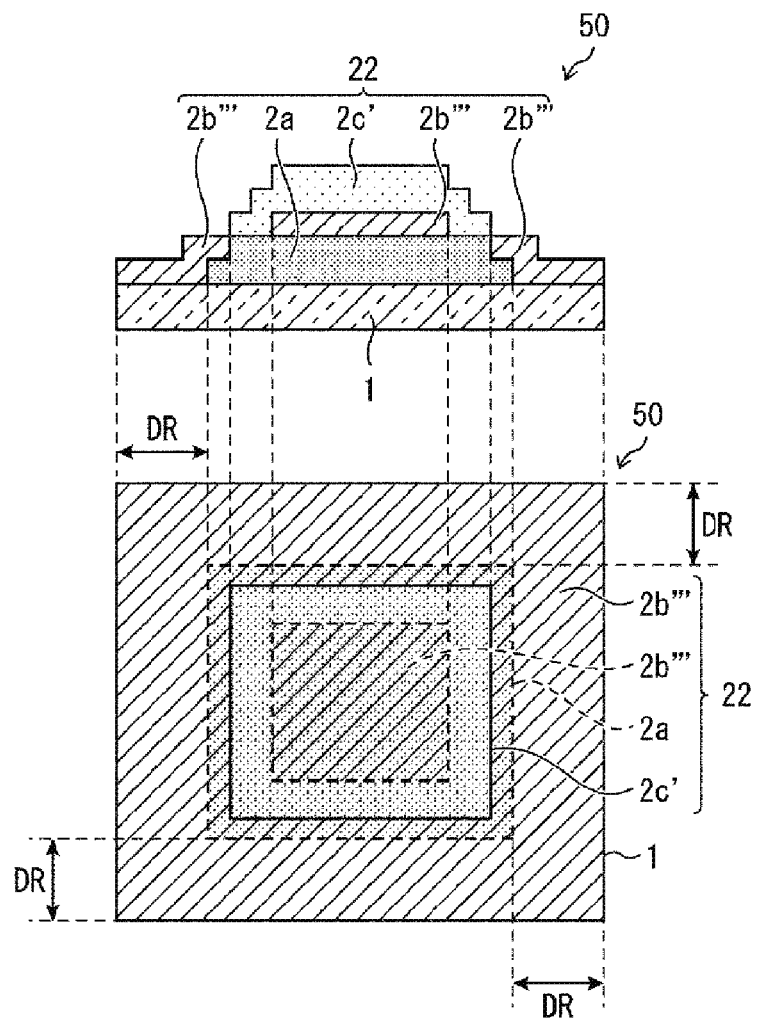
FIG. 8 is a plan view of the non-flexible substrate including the base layer illustrated in FIGS. 7A to 7E.

FIG. 8 is a plan view of the non-flexible substrate 50 including the base layer 22 illustrated in (e) of FIGS. 7A to 7E.

The present embodiment is described with an example in which a single large base layer 22 is formed on the glass substrate 1 as illustrated in FIG. 8 to realize a relatively large flexible display device. However, no such limitation is intended, and a plurality of island shaped base layers may be formed on the glass substrate 1 as described in a sixth embodiment described below.

Note that the materials of the first resin layer 2*a*, the inorganic film 2*b*', and the second resin layer 2*c*' can be the same as the materials of the first resin layer 2*a*, the inorganic film 2*b*', and the second resin layer 2*c* of the first or second embodiment described above. Thus, the description thereof will be omitted.

As illustrated in (e) of FIGS. 7A to 7E and FIG. 8, in the non-flexible substrate 50 including the base layer 22 including the layered film of the first resin layer 2*a*, the inorganic film 2*b*''', and the second resin layer 2*c*', the inorganic film 2*b*''' is formed covering the end portion of the first resin layer 2*a* and in contact with the glass substrate 1 in the end portion region DR of the glass substrate 1.

The shape of the inorganic film 2*b* illustrated in (b) of FIGS. 7A to 7E greatly increases the adhesion between the first resin layer 2*a* and the glass substrate 1. This is because a portion is provided that is formed covering the end portion of the first resin layer 2*a* and in contact with the glass substrate 1 in the end portion region DR of the glass substrate 1.

Thus, in the step of dry etching illustrated in (c) of FIGS. 7A to 7E, because a portion formed covering the end portion of the first resin layer 2*a* and in contact with the glass substrate 1 in the end portion region DR of the glass substrate 1 remains, a state of the first resin layer 2*a* being resistant to being film peeled from the glass substrate 1 can be maintained.

This effect is similar to the effect obtained by forming the inorganic film 2*b* using a vapor deposition mask so that a region of the first resin layer 2*a* near the end portion region DR of the glass substrate 1 is exposed and so that it covers the end portion of the first resin layer 2*a* and is in contact with the glass substrate 1 in the end portion region DR of the glass substrate 1.

Thus, in the non-flexible substrate 50 including the base layer 22, for example, in a washing step and the like included in a post-process, a state of the first resin layer 2*a* being resistant to being film peeled from the glass substrate 1 can be maintained.

Also, in the case of a flexible display device obtained through performing each of the steps (from the step of forming the moisture-barrier layer to the LLO step) on the non-flexible substrate 50 including the base layer 22, in each of the steps described above, a state of the first resin layer 2*a* being resistant to being film peeled from the glass substrate 1 can be maintained. Thus, a flexible display device with high yield can be realized.

Note that in the non-flexible substrate 50 including the base layer 22, at the end portion of the base layer 22, the first resin layer 2*a* and the second resin layer 2*c*' are formed in contact with one another.

On the other hand, in the case of a flexible display device including the base layer 22, at the end portion of the base layer 22, the first resin layer 2*a* and the second resin layer 2*c*' are formed in contact with one another. However, in some examples, the flexible display device including the base layer 22 is singulated into a plurality. In such a case when the step of dividing by laser or the like at the inner side of the base layer 22 is included, depending on the divided section, portions where the first resin layer 2*a* and the second resin layer 2*c*' are formed in contact with one another may be removed and the flexible display device after singulation may not include these portions. In this case, only the portion of the first resin layer 2*a* in contact with the back film 111, i.e., a flexible substrate, via the adhesive layer 110 remains.

Sixth Embodiment

Next, with reference to FIG. 9, a sixth embodiment of the present invention will be described. A non-flexible substrate 60 according to the present embodiment is different from the fifth embodiment in that a plurality of base layers 22' are formed on the glass substrate 1, and the other matters are as described in the fifth embodiment. For convenience of description, members having the same functions as those of the members illustrated in the drawings in the fifth embodiment are denoted by the same reference numerals, and descriptions thereof will be omitted.

Figure 9:
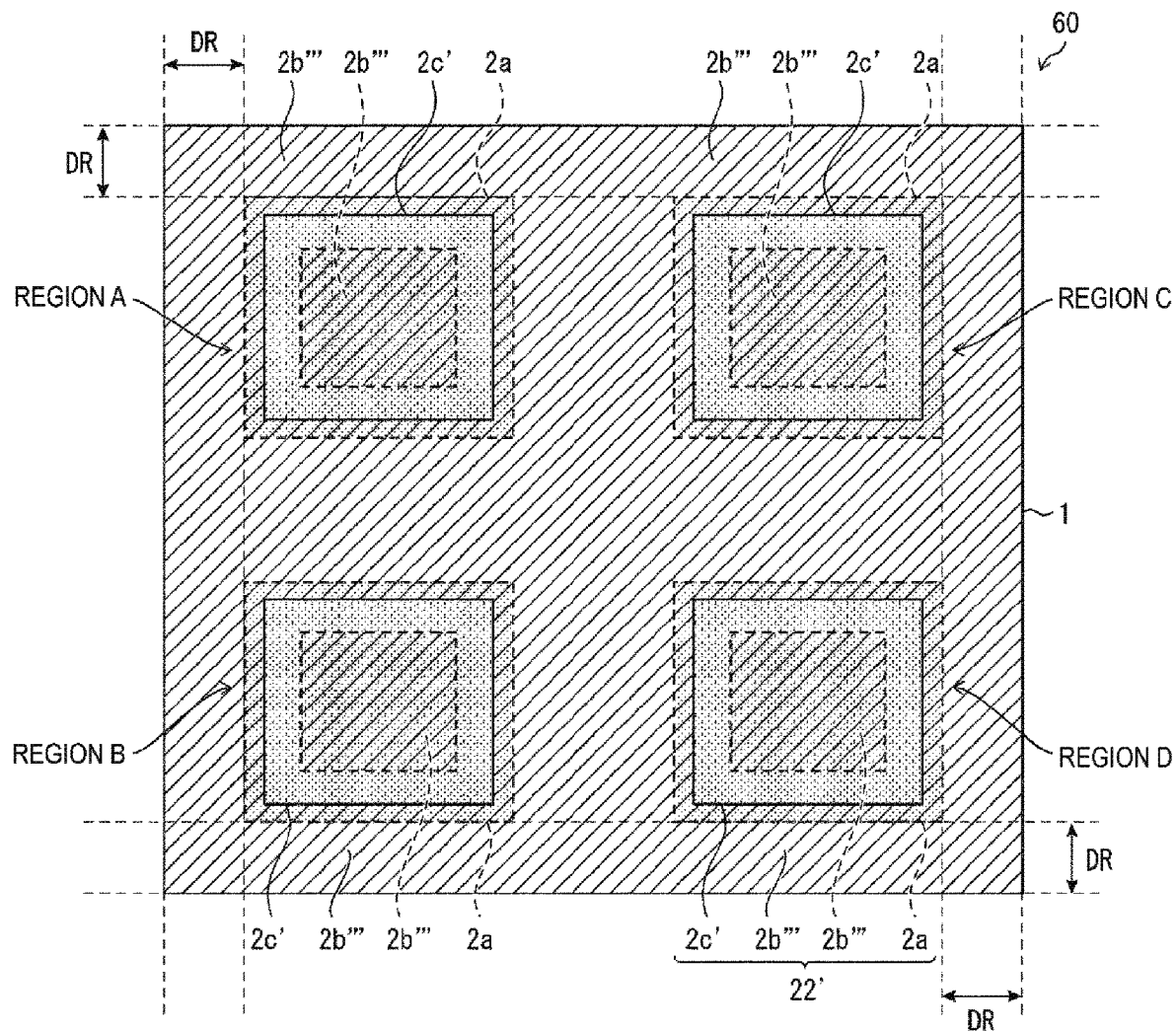
FIG. 9 is a plan view of a non-flexible substrate including a base layer according to a sixth embodiment.

FIG. 9 is a plan view of the non-flexible substrate 60 including the plurality of base layers 22'.

As illustrated in FIG. 9, in the non-flexible substrate 60, the base layer 22' with the same shape as the base layer 22 in the fifth embodiment described above is disposed on the glass substrate 1 as a plurality of base layers (four in the present embodiment).

That is, the base layers 22' are formed in an island shape in each region of a region A, a region B, a region C, and a region D, on the glass substrate 1.

As illustrated in FIG. 9, the first resin layer 2a is formed as a plurality of island shaped layers (four in the present embodiment) inward from the end portion region DR of the glass substrate 1.

Furthermore, the inorganic films 2b''' are formed so that the first resin layer 2a is exposed inward from the outer edge portion of the plurality of island shaped first resin layers 2a and so as to cover the outer edge portions of the first resin layers 2a and be in contact with the glass substrate 1.

Then, the second resin layer 2c' is formed as a plurality of island shaped films (four in the present embodiment) in contact with the first resin layer 2a exposed from the inorganic film 2b''.

The present embodiment is an example in which the inorganic film is formed covering the plurality of island shaped first resin layers 2a and the glass substrate 1, then by removing the inorganic film formed in direct contact with the plurality of first resin layers 2a inward from the outer edge portions of each of the first resin layers 2a, the plurality of first resin layers 2a are exposed from the inorganic film 2b' inward from the outer edge portions of each of the plurality of first resin layers 2a. However, no such limitation is intended.

Because each of the plurality of base layers 22' provided on the glass substrate 1 have the same shape of the base layer 22 in the fifth embodiment described above, in the non-flexible substrate 60 including the plurality of base layers 22', for example, in a washing step and the like included in a post-process, a state of the first resin layer 2a being resistant to being film peeled from the glass substrate 1 can be maintained.

Also, in the case of a plurality of flexible display device obtained through performing each of the steps of the fifth embodiment described above (from the step of forming the moisture-barrier layer to the LLO step) and an additional step of dividing by laser or the like on the non-flexible substrate 60 including the plurality of base layers 22', in the steps described above, a state of the first resin layer 2a being resistant to being film peeled from the glass substrate 1 can be maintained. Thus, a flexible display device with high yield can be realized.

Note that in the present embodiment, as illustrated in FIG. 9, the inorganic film 2b''' is formed continuously in the outer sides of each region of the region A, the region B, the region C, and the region D. However, no such limitation is intended. The inorganic film 2b''' may not be formed at divided sections in a dividing step using a laser or the like.

Note that in the non-flexible substrate 60 including the plurality of base layers 22' formed in the region A, the region B, the region C, and the region D, at the end portions of the plurality of base layers 22', the first resin layers 2a and the second resin layers 2c' are formed in contact with one another.

On the other hand, in the case of a flexible display device including the plurality of base layers 22', being divided at the outer side of each region of the region A, the region B, the region C, and the region D and singulated into a plurality, at the end portions of the plurality of base layers 22', the first resin layer 2a and the second resin layer 2c' are formed in contact with one another. However, in some examples, the flexible display device including the plurality of base layers 22' is divided on the inner side of each region of the region A, the region B, the region C, and the region D and singulated into a plurality. In such a case, after the flexible display device is singulated, portions where the first resin layer 2a and the second resin layer 2c' are formed in contact with one another may be removed and the flexible display device after singulation may not include these portions. In this case, only the portion of the first resin layer 2a in contact with the back film 111, i.e., a flexible substrate, via the adhesive layer 110 remains.

Supplement

To solve the problem described above, a method of manufacturing a flexible display device according to a first aspect of the present invention includes forming a base layer on a non-flexible substrate, the base layer including a first resin layer, an inorganic film, and a second resin layer layered in this order, wherein the forming of a base layer includes a first step of forming the first resin layer inward from an end portion region of the non-flexible substrate, a second step of forming the inorganic film on at least a portion of the first resin layer such that a portion of the non-flexible substrate and/or a portion of the first resin layer is exposed, and a third step of forming the second resin layer in contact with a portion of the non-flexible substrate exposed from the inorganic film and/or a portion of the first resin layer exposed from the inorganic film, and the method further includes peeling the non-flexible substrate and bonding a flexible substrate via an adhesive layer.

According to the method described above, a flexible display device with high yield can be manufactured.

The method of manufacturing a flexible display device according to a second aspect of the present invention is the same as the first aspect, wherein in the second step, the inorganic film may be formed such that the non-flexible substrate is exposed on an outer side of the first resin layer, and in the third step, the second resin layer is formed in contact with the non-flexible substrate exposed from the inorganic film.

According to the method described above, a flexible display device with high yield can be manufactured.

The method of manufacturing a flexible display device according to a third aspect of the present invention is the same as the second aspect, wherein in the second step, the inorganic film may be formed covering the first resin layer and the non-flexible substrate, then, by removing the inorganic film formed directly on the non-flexible substrate, the non-flexible substrate may be exposed from the inorganic film on the outer side of the first resin layer.

According to the method described above, a flexible display device with high yield can be manufactured.

The method of manufacturing a flexible display device according to a fourth aspect of the present invention is the same as the first aspect, wherein in the second step, the inorganic film may be formed such that the first resin layer is exposed at an outer edge portion of the first resin layer, and in the third step, the second resin layer may be formed in contact with the first resin layer exposed from the inorganic film.

According to the method described above, a flexible display device with high yield can be manufactured.

The method of manufacturing a flexible display device according to a fifth aspect of the present invention is the same as the fourth aspect, wherein in the second step, the inorganic film may be formed covering the first resin layer and the non-flexible substrate, then, by removing the inorganic film formed directly on at least the outer edge portion of the first resin layer, the first resin layer may be exposed from the inorganic film at the outer edge portion of the first resin layer.

According to the method described above, a flexible display device with high yield can be manufactured.

The method of manufacturing a flexible display device according to a sixth aspect of the present invention is the same as the first aspect, wherein in the second step, the inorganic film may be formed such that the first resin layer is exposed inward from an outer edge portion of the first resin layer, and in the third step, the second resin layer may be formed in contact with the first resin layer exposed from the inorganic film.

According to the method described above, a flexible display device with high yield can be manufactured.

The method of manufacturing a flexible display device according to a seventh aspect of the present invention is the same as the sixth aspect, wherein in the second step, the inorganic film may be formed covering the first resin layer and the non-flexible substrate, then, by removing the inorganic film formed directly on the first resin layer inward from the outer edge portion of the first resin layer, the first resin layer may be exposed from the inorganic film inward from the outer edge portion of the first resin layer.

According to the method described above, a flexible display device with high yield can be manufactured.

The method of manufacturing a flexible display device according to an eighth aspect of the present invention is the same as the first aspect, wherein in the first step, the first resin layer may be formed as a plurality of island shaped first resin layers inward from an end portion region of the non-flexible substrate, in the second step, the inorganic film may be formed as a plurality of island shaped inorganic films such that the non-flexible substrate is exposed on an outer side of the plurality of island shaped first resin layers, and in the third step, the second resin layer may be formed in a plurality of island shaped second resin layers in contact with the non-flexible substrate exposed from the plurality of island shaped inorganic films.

According to the method described above, a flexible display device with high yield can be manufactured.

The method of manufacturing a flexible display device according to a ninth aspect of the present invention is the same as the eighth aspect, wherein in the second step, the plurality of island shaped inorganic films may be formed covering the plurality of island shaped first resin layers and the non-flexible substrate, then, by removing the plurality of island shaped inorganic films formed directly on the non-flexible substrate, the non-flexible substrate may be exposed from the plurality of island shaped inorganic films at the outer side of the plurality of island shaped first resin layers.

According to the method described above, a flexible display device with high yield can be manufactured.

The method of manufacturing a flexible display device according to a tenth aspect of the present invention is the same as the first aspect, wherein in the first step, the first resin layer may be formed as a plurality of island shaped first resin layers inward from an end portion region of the non-flexible substrate, in the second step, the inorganic film may be formed as a plurality of island shaped inorganic films such that the plurality of island shaped first resin layers are exposed on outer edge portions of the plurality of island shaped first resin layers, and in the third step, the second resin layer may be formed in a plurality of island shaped second resin layers in contact with the plurality of island shaped first resin layers exposed from the plurality of island shaped inorganic films.

According to the method described above, a flexible display device with high yield can be manufactured.

The method of manufacturing a flexible display device according to an eleventh aspect of the present invention is the same as the tenth aspect, wherein in the second step, the plurality of island shaped inorganic films may be formed covering the plurality of island shaped first resin layers and the non-flexible substrate, then, by removing the plurality of island shaped inorganic films formed directly on at least the outer edge portions of the plurality of island shaped first resin layers, the plurality of island shaped first resin layers may be exposed from the plurality of island shaped inorganic films at the outer edge portions of the plurality of island shaped first resin layers.

According to the method described above, a flexible display device with high yield can be manufactured.

The method of manufacturing a flexible display device according to a twelfth aspect of the present invention is the same as the first aspect, wherein in the first step, the first resin layer may be formed as a plurality of island shaped first resin layers inward from an end portion region of the non-flexible substrate, in the second step, the inorganic film may be formed such that the plurality of island shaped first resin layers are exposed inward from outer edge portions of the plurality of island shaped first resin layers, and in the third step, the second resin layer may be formed in a plurality of island shaped second resin layers in contact with the plurality of island shaped first resin layers exposed from the inorganic film.

According to the method described above, a flexible display device with high yield can be manufactured.

The method of manufacturing a flexible display device according to a thirteenth aspect of the present invention is the same as the twelfth aspect, wherein in the second step, the inorganic film may be formed covering the plurality of island shaped first resin layers and the non-flexible substrate, then, by removing the inorganic film formed directly on the plurality of island shaped first resin layers inward from the outer edge portion of the first resin layer, the plurality of island shaped first resin layers may be exposed from the inorganic film inward from the outer edge portions of the plurality of island shaped first resin layers.

According to the method described above, a flexible display device with high yield can be manufactured.

The method of manufacturing a flexible display device according to a fourteenth aspect of the present invention is the same as the second, third, eighth, and ninth aspect, wherein in the peeling the non-flexible substrate and bonding the flexible substrate to at least the first resin layer via the adhesive layer, the second resin layer formed in contact with the non-flexible substrate may also be bonded to the flexible substrate via the adhesive layer.

According to the method described above, a flexible display device with high yield can be manufactured.

The method of manufacturing a flexible display device according to a fifteenth aspect of the present invention is the same as the fourth, fifth, tenth, and eleventh aspect, wherein in the peeling the non-flexible substrate and bonding the flexible substrate to at least the first resin layer via the adhesive layer, only the first resin layer may be bonded to the flexible substrate via the adhesive layer.

According to the method described above, a flexible display device with high yield can be manufactured.

The method of manufacturing a flexible display device according to a sixteenth aspect of the present invention is the same as the seventh or thirteenth aspect, wherein in the peeling the non-flexible substrate and bonding the flexible substrate to at least the first resin layer via the adhesive layer, the inorganic film formed in contact with the non-flexible substrate may also be bonded with the flexible substrate via the adhesive layer.

According to the method described above, a flexible display device with high yield can be manufactured.

The method of manufacturing a flexible display device according to a seventeenth aspect of the present invention is the same as any one from the first to sixteenth aspect, further includes dividing the flexible substrate including the base layer after the bonding with the flexible substrate, wherein in the dividing of the flexible substrate including the base layer, by dividing the flexible substrate including the base layer, a plurality of flexible display devices may be obtained.

According to the method described above, a flexible display device with high yield can be manufactured.

To solve the problem described above, a non-flexible substrate including a base layer according to an eighteenth aspect of the present invention includes a non-flexible substrate, and a base layer disposed on the non-flexible substrate. wherein the base layer includes a portion where a first resin layer, an inorganic film, and a second resin layer are layered in this order, and at an end portion of the base layer, the second resin layer is formed in contact with the non-flexible substrate or the first resin layer.

According to the configuration described above, a non-flexible substrate including a base layer resistant to film peeling during a manufacturing process can be realized.

The non-flexible substrate including a base layer according to a nineteenth aspect of the present invention is the same as the eighteenth aspect, wherein the portion of the base layer where the first resin layer, the inorganic film, and the second resin layer are layered in this order may be located on an inner side from an end portion region of the non-flexible substrate, and at the end portion region of the base layer, the second resin layer may be formed in contact with the non-flexible substrate in the end portion region of the non-flexible substrate.

According to the configuration described above, a non-flexible substrate including a base layer resistant to film peeling during a manufacturing process can be realized.

The non-flexible substrate including a base layer according to a twentieth aspect of the present invention is the same as the eighteenth aspect, wherein the portion of the base layer where the first resin layer, the inorganic film, and the second resin layer are layered in this order may be located on an inner side from an end portion region of the non-flexible substrate, the inorganic film may be formed such that an end portion of the first resin layer is exposed inward from an end portion region of the non-flexible substrate, and at the end portion region of the base layer, the second resin layer may be formed in contact with the first resin layer inward from the end portion region of the non-flexible substrate.

According to the configuration described above, a non-flexible substrate including a base layer resistant to film peeling during a manufacturing process can be realized.

The non-flexible substrate including a base layer according to a twenty-first aspect of the present invention is the same as the eighteenth aspect, wherein the portion of the base layer where the first resin layer, the inorganic film, and the second resin layer are layered in this order may be located on an inner side from an end portion region of the non-flexible substrate, the inorganic film may be formed such that a portion of the first resin layer is exposed inward from an end portion region of the non-flexible substrate and is formed on the first resin layer and in an end portion region of the non-flexible substrate overlapping an end portion of the first resin layer as viewed in a plan view, and at the end portion region of the base layer, the second resin layer may be formed in contact with the first resin layer inward from the end portion region of the non-flexible substrate.

According to the configuration described above, a non-flexible substrate including a base layer resistant to film peeling during a manufacturing process can be realized.

The non-flexible substrate including a base layer according to a twenty-second aspect of the present invention is the same as any one of the eighteenth to the twenty-first aspect, wherein the base layer may be formed as a plurality of base layers.

According to the configuration described above, a non-flexible substrate including a base layer resistant to film peeling during a manufacturing process can be realized.

The non-flexible substrate including a base layer according to a twenty-third aspect of the present invention is the same as the twenty-second aspect, wherein the base layer may be formed as a plurality of island shaped base layers.

According to the configuration described above, a non-flexible substrate including a base layer resistant to film peeling during a manufacturing process can be realized.

The non-flexible substrate including a base layer according to a twenty-fourth aspect of the present invention is the same as any one of the eighteenth to twenty-third aspect, wherein the first resin layer and the second resin layer may be formed of a material including a polyimide resin.

According to the configuration described above, a non-flexible substrate including a base layer resistant to film peeling during a manufacturing process can be realized.

To solve the problem described above, a flexible display device according to a twenty-fifth aspect of the present invention includes a flexible substrate, a base layer disposed on the flexible substrate, and a display element disposed on the base layer, wherein the base layer includes a portion where a first resin layer, an inorganic film, and a second resin layer are layered in this order, and at an end portion of the base layer, the second resin layer is formed in contact with the first resin layer or the flexible substrate via an adhesive layer.

According to the configuration described above, a flexible display device with high yield can be realized.

The flexible display device according to a twenty-sixth aspect of the present invention is the same as the twenty-fifth aspect, wherein the first resin layer and the second resin layer may be formed of a material including a polyimide resin.

According to the configuration described above, a flexible display device with high yield can be realized.

Additional Items

The present invention is not limited to each of the embodiments described above, and various modifications may be made within the scope of the claims. Embodiments obtained by appropriately combining technical approaches disclosed in each of the different embodiments also fall within the technical scope of the present invention. Moreover, novel technical features can be formed by combining the technical approaches disclosed in the embodiments.

INDUSTRIAL APPLICABILITY

The present invention is applicable to a flexible display device and a method for manufacturing a flexible display device.

REFERENCE SIGNS LIST

1 Glass substrate (non-flexible substrate)
2, 2', 12, 12', 22, 22' Base layer
2a First resin layer
2b', 2b'', 2b' Inorganic film
2c, 2c' Second resin layer
10, 20, 30, 40, 50, 60 Non-flexible substrate including a base layer
105R Red light-emitting organic EL element (display element)
105G Green light-emitting organic EL element (display element)
105B Blue light-emitting organic EL element (display element)
110 Adhesive layer
111 Back film (flexible substrate)
DR End portion region

The invention claimed is:

1. A flexible display device comprising:
a base layer in which a first resin layer, an inorganic film, and a second resin layer are layered in this order; and
a display element disposed on the base layer, wherein
in the base layer,
the inorganic film is provided such that the first resin layer and the second resin layer are layered to be in contact with each other in at least a portion of an outer edge portion of the base layer, wherein
a thickness of the base layer in a layer direction at a position where the second resin layer and the first resin layer are layered to be in contact with each other is smaller than that of the base layer in the layer direction at a position where the first resin layer, the inorganic film, and the second resin layer are layered in this order, wherein
the first resin layer, the inorganic film, the second resin layer, and the display element are provided in this order.

2. The flexible display device according to claim 1, wherein
in the outer edge portion of the base layer where the second resin layer and the first resin layer are layered to be in contact with each other,
a thickness of the base layer in the layer direction at a position relatively far from the inorganic film is smaller than that of the base layer in the layer direction at a position relatively close to the inorganic film.

3. The flexible display device according to claim 1, wherein
the first resin layer and the second resin layer are formed with a material including a polyimide resin.

4. The flexible display device according to claim 1, further comprising:
a flexible substrate, wherein:
the base layer is disposed on the flexible substrate; and
the display element is disposed on the base layer.

5. A flexible display device comprising:
a base layer in which a first resin layer, an inorganic film, and a second resin layer are layered in this order; and
a display element disposed on the base layer, wherein
in the base layer,
the inorganic film is provided such that the first resin layer and the second resin layer are layered to be in contact with each other in an entire periphery of an outer edge portion of the base layer, wherein
a thickness of the base layer in a layer direction at a position where the second resin layer and the first resin layer are layered to be in contact with each other is smaller than that of the base layer in the layer direction at a position where the first resin layer, the inorganic film and the second resin layer are layered in this order, wherein
the first resin layer, the inorganic film, the second resin layer, and the display element are provided in this order.

6. The flexible display device according to claim 5, wherein
in the outer edge portion of the base layer where the second resin layer and the first resin layer are layered to be in contact with each other,
a thickness of the base layer in the layer direction at a position relatively far from the inorganic film is smaller than that of the base layer in the layer direction at a position relatively close to the inorganic film.

7. The flexible display device according to claim 5, wherein
the first resin layer and the second resin layer are formed with a material including a polyimide resin.

8. The flexible display device according to claim 5, further comprising:
a flexible substrate, wherein:
the base layer is disposed on the flexible substrate; and
the display element is disposed on the base layer.

9. A flexible display device comprising:
a base layer in which a first resin layer, an inorganic film, and a second resin layer are layered in this order; and
a display element disposed on the base layer, wherein
in the base layer,
the inorganic film is provided such that the first resin layer and the second resin layer are layered to be in contact with each other in at least a portion of an outer edge portion of the base layer, wherein
a thickness of the base layer in a layer direction at a position where the second resin layer and the first resin layer are layered to be in contact with each other is smaller than that of the base layer in the layer direction at a position where the first resin layer, the inorganic film, and the second resin layer are layered in this order, wherein
the inorganic film is provided directly on the first resin layer.

10. The flexible display device according to claim 9, wherein
in the outer edge portion of the base layer where the second resin layer and the first resin layer are layered to be in contact with each other,
a thickness of the base layer in the layer direction at a position relatively far from the inorganic film is smaller than that of the base layer in the layer direction at a position relatively close to the inorganic film.

11. The flexible display device according to claim 9, wherein the first resin layer and the second resin layer are formed with a material including a polyimide resin.

12. The flexible display device according to claim 9, further comprising:
a flexible substrate, wherein:
the base layer is disposed on the flexible substrate; and
the display element is disposed on the base layer.

* * * * *